(12) United States Patent
Chambers

(10) Patent No.: US 7,001,459 B2
(45) Date of Patent: Feb. 21, 2006

(54) SPINEL-STRUCTURED METAL OXIDE ON A SUBSTRATE AND METHOD OF MAKING SAME BY MOLECULAR BEAM EPITAXY

(75) Inventor: Scott A. Chambers, Kennewick, WA (US)

(73) Assignee: Battelle Memorial Institute, Richland, WA (US)

( * ) Notice: Subject to any disclaimer, the term of this patent is extended or adjusted under 35 U.S.C. 154(b) by 0 days.

(21) Appl. No.: 10/653,035

(22) Filed: Aug. 29, 2003

(65) Prior Publication Data

US 2004/0123797 A1 Jul. 1, 2004

Related U.S. Application Data

(63) Continuation of application No. 09/840,748, filed on Apr. 23, 2001, now abandoned.

(51) Int. Cl.
*C30B 25/02* (2006.01)

(52) U.S. Cl. .............................. 117/84; 117/88; 117/89; 117/92; 117/93; 117/85; 117/103; 117/108; 117/917; 117/946

(58) Field of Classification Search ................. 117/84, 117/85, 88, 92, 102, 103, 108, 89, 105, 93, 117/86, 917, 946

See application file for complete search history.

(56) References Cited

U.S. PATENT DOCUMENTS

| 5,350,737 | A |   | 9/1994  | Harada et al. |
| 5,362,711 | A | * | 11/1994 | Takada et al. ............... 505/476 |
| 5,448,084 | A |   | 9/1995  | Hoke et al. |
| 5,450,812 | A | * | 9/1995  | McKee et al. ................. 117/84 |
| 5,695,863 | A | * | 12/1997 | Bloemen et al. ............ 428/212 |

OTHER PUBLICATIONS

Lu et al. "Improved method of nonintrusive depostion rate monitoring by atomic absorption spectroscopy for physical vapor deposition processes". J. Vac. Sci. Technol. A 13(3), May/Jun. 1995. pp 1797-1801.*

(Continued)

*Primary Examiner*—Duane Smith
*Assistant Examiner*—Matthew J. Song
(74) *Attorney, Agent, or Firm*—Klarquist Sparkman, LLP

(57) ABSTRACT

A method of making a spinel-structured metal oxide on a substrate by molecular beam epitaxy, comprising the step of supplying activated oxygen, a first metal atom flux, and at least one other metal atom flux to the surface of the substrate, wherein the metal atom fluxes are individually controlled at the substrate so as to grow the spinel-structured metal oxide on the substrate and the metal oxide is substantially in a thermodynamically stable state during the growth of the metal oxide. A particular embodiment of the present invention encompasses a method of making a spinel-structured binary ferrite, including Co ferrite, without the need of a post-growth anneal to obtain the desired equilibrium state.

19 Claims, 5 Drawing Sheets

OTHER PUBLICATIONS

Hu et al. "Structural tuning of the magnetic behavior in spinel-structure ferrite thin films" Physical Review B vol. 62, num. 2, Jul. 2000, pp R779-R782.*

Lind et al., *Growth and structual characterization of Fe3O4 and MiO Thin Films*, Phys. Rev. B 45 (4) 1838-1850, Jan. 15, 1992.

Chambers, S. A., *Epitaxial growth and properties of thin film oxides*, Surf. Sci. Rep. 39, 2000 Elsevier Science B. V., 105-180.

Suzuki et al., *Structure and magnetic properties of epitaxial spinel ferrite thin films*, (1) (Appl. Phys. Lett. 68 (5) 714-716, Jan. 29, 1996).

Suzuki et al., *Magnetic anisotropy of epitaxial cobalt ferrite thin films*, (2) (J. of Magnetism and Magnetic Materials 191 (1999) 1-8.

Hu et al., *Structural tuning of the magnetic behavior in spinel-structure ferrite thin films*, (Phys. Rev. B62 (2) R779-782, Jul. 1, 2000).

C. Lu, Y. Guan, *Improved method of nonintrusive deposition rate monitoring by atomic absorption* . . . J. Vac. Sci. Technol. A13 (3) 1797-1801, May/Jun. 1995.

* cited by examiner

SPINEL-STRUCTURED METAL OXIDE ON A SUBSTRATE AND METHOD OF MAKING SAME BY MOLECULAR BEAM EPITAXY

CROSS-REFERENCE TO RELATED APPLICATIONS

The present application is a continuation of U.S. patent application Ser. No. 09/840,748 filed 23 Apr. 2001 now abandoned.

STATEMENT REGARDING FEDERALLY-SPONSORED RESEARCH OR DEVELOPMENT

This invention was made with Government support under Contract DE-AC0676RLO1830 awarded by the U.S. Department of Energy. The Government has certain rights in the invention

TECHNICAL FIELD

This invention relates to spinel-structured metal oxides epitaxially grown on substrates by molecular beam epitaxy. More particularly but not exclusively, this invention relates to a method of making a thin film of an inverse spinel-structured binary ferrite, such as $CoFe_2O_4$, on a substrate for magnetic media applications.

BACKGROUND INFORMATION

Growth of high-quality spinel-structured metal oxide films on substrates is important in a variety of chemical, electronic, and magnetic applications. Many of the technological advances in this field have been in the techniques to grow high quality $Fe_3O_4$ (magnetite) thin films utilizing physical vapor deposition techniques such as plasma laser deposition (PLD) and molecular beam epitaxy (MBE), for example as disclosed in Lind et al. Phys. Rev. B 45 (4) 1838, 15 Jan. 1992 and Chambers, S.A. Surf. Sci. Rep. 39 (2000) 105. Less progress has been achieved, however, in producing high-quality spinel-structured metal oxide films having more than one metal constituent, such as the binary oxides of $CoFe_2O_4$ (Co ferrite), $NiFe_2O_4$ (Ni ferrite), and $CoCr_2O_4$ (Co chromite), and the ternary oxide of $(Mn,Zn)Fe_2O_4$. Co ferrite is of particular interest for a variety of next-generation magnetic read/write technologies because it exhibits magnetic properties that are significantly enhanced compared to those of other magnetic oxides.

Although the bulk properties of Co ferrite have been known for decades, thin film synthesis and characterization efforts have been limited. Suzuki et al. (1) (Appl. Phys. Lett. 68 (5) 714, 29 Jan. 1996), Suzuki et al. (2) (J. of Magnetism and Magnetic Materials 191 (1999) 1), and Hu et al. (Phys. Rev. B 62 (2) R779, 1 Jul. 2000) disclose PLD techniques to grow Co ferrite on a variety of substrates, including MgO, $SrTiO_3$ and $MgAl_2O_4$. Hu et al. asserts that epitaxial Co ferrite of high magnetic and structural quality cannot be grown without the use of a complex crystal symmetry and lattice parameter matching scheme involving the use of buffer layer, such as $CoCr_2O_4$, on substrates such as $MgAl_2O_4$. Substrates of different symmetry, such as MgO, are thought to result in the nucleation and growth of Co ferrite that has high concentrations of a particular structural defect called an antiphase boundary, and that the presence of these defects compromises the magnetic properties. Even with these more complex substrate/buffer layer combinations, a post-growth anneal is required to obtain the desired structural and magnetic properties when PLD is used as the growth method. Furthermore, PLD-grown film surfaces show considerable roughness (see FIG. 1 of Suzuki et al. (2)) which precludes the formation of laminar film structures and superlattices.

Further improvement in current methods, however, is necessary if magnetic spinels are to be broadly useful in magnetic media applications. Desirable properties include hysteretic magnetization loops and atomically flat films grown on simple substrates, such as MgO. PLD has not produced Co ferrite with these desirable properties. Accordingly, there is a need for an improved process for epitaxially growing a spinel-structured metal oxide on a substrate.

BRIEF SUMMARY OF THE INVENTION

An embodiment of the present invention encompasses a method of making a spinel-structured metal oxide on a substrate by molecular beam epitaxy, the metal oxide comprising oxygen atoms, first metal atoms, and at least one other metal atoms, wherein the metal atoms substantially occupy thermodynamically stable lattice positions of the metal oxide during the growth of the metal oxide on the substrate.

Another embodiment of the present invention encompasses a method of making a spinel-structured metal oxide on a substrate by oxygen plasma assisted molecular beam epitaxy. This embodiment comprises the step of supplying activated oxygen, a first metal atom flux, and at least one other metal atom flux to the surface of the substrate, wherein the metal atom fluxes are individually controlled at the substrate so as to grow the spinel-structured metal oxide on the substrate and the metal oxide is substantially in a thermodynamically stable state during the growth of the metal oxide.

A particular embodiment of the present invention encompasses a method of making a spinel-structured binary ferrite on a substrate, wherein the binary ferrite is substantially in a thermodynamically stable state during the growth of the binary ferrite.

A more particular embodiment of the present invention encompasses a method of growing Co ferrite on a substrate, wherein the Co ferrite is substantially in a thermodynamically stable state during the growth of the Co ferrite.

It is an object of the present invention to provide a spinel-structured metal oxide with improved properties resulting from the metal oxide being substantially in a thermodynamically stable state without having undergone a post-growth annealing treatment.

It is a further object of the present invention to provide a spinel-structured metal oxide film having at least two metal constituents and an atomically flat surface.

It is a further object of the present invention to make a metal oxide with an inverse spinel structure, such as Co ferrite, without the need of a post-growth annealing treatment.

It is a further object of the present invention to provide a high quality Co ferrite film that can be used, for example, in magnetic media applications.

Another embodiment of the present invention includes a method of making a spinel-structured metal oxide on a substrate by molecular beam epitaxy. The metal oxide comprises oxygen atoms, first metal atoms, and at least one other metal atoms. The metal atoms substantially occupy thermodynamically stable lattice positions of the metal oxide. The method comprises the steps of: providing a substrate in a growth chamber; reducing the pressure in the growth chamber to a pressure suitable for epitaxial growth by molecular beam epitaxy; heating the substrate to a suitable growth temperature; supplying activated oxygen, a first metal atom flux, and at least one other metal atom flux to the surface of the substrate, wherein the metal atom fluxes are individually controlled at the substrate so as to grow the spinel-structured metal oxide having the metal atoms substantially occupying thermodynamically stable lattice positions of the metal oxide during the growth of the metal oxide; terminating the supply of the activated oxygen, the first metal atom flux, and the at least one other metal atom flux at the surface of the substrate once the desired thickness of the metal oxide is formed on the substrate; and cooling the metal oxide to room temperature. This embodiment can further comprise the step of growing a spinel buffer layer on the substrate by molecular beam epitaxy prior to growing the metal oxide on the substrate.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION OF THE INVENTION

Figure 1:
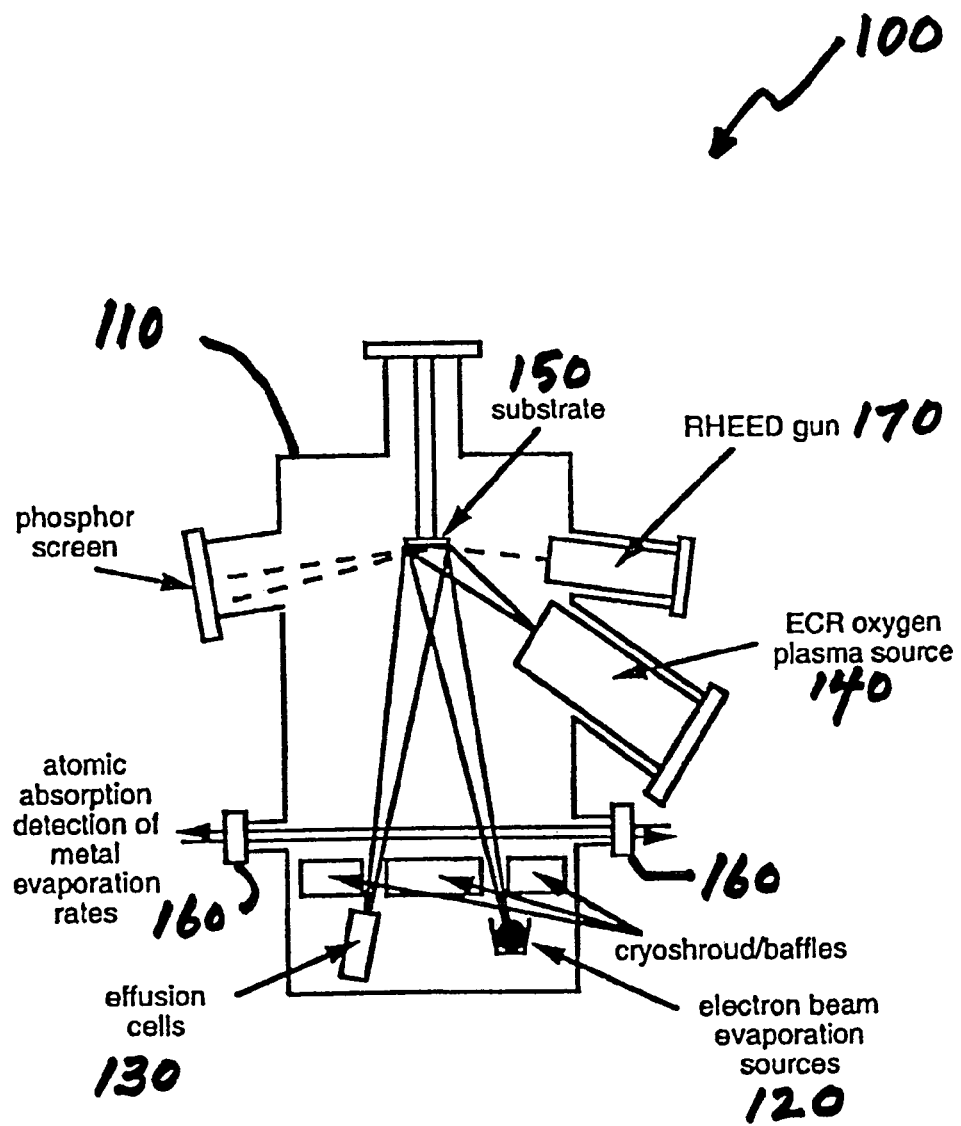
FIG. 1 schematically illustrates an example of a molecular beam epitaxy system that can be used in producing the spinel-structured metal oxide of the present invention. This particular system comprises an electron cyclotron resonance oxygen plasma generator as the source of activated oxygen and an atomic absorption spectroscopy detection system (not shown) for determining, monitoring, and controlling metal evaporation and deposition rates.

FIG. 1 schematically illustrates an example of an MBE system 100 that can be used in producing the spinel-structured metal oxide on a substrate of the present invention. This MBE system 100 comprises a growth chamber 110 having a combination of electron beam evaporator sources 120 and effusion cells 130 for the metals, and an electron cyclotron resonance (ECR) oxygen plasma source 140 for the activated oxygen. Single-pocket electron beam evaporator sources are preferred because simultaneous evaporation and independent detection is needed to grow binary or ternary metal oxides. Electron beam evaporator sources 120 are typically used for more refractory metals, whereas high-temperature effusion cells (up to 1500° C.) are typically used for more volatile metals.

An atomic absorption spectroscopy (AAS) detection system (not shown, but described in C. Lu, Y. Guan, J. Vac. Sci. Technol. A 13 (3) 1797, May/June 1995, incorporated by reference herein to the extent not inconsistent with the disclosure herewith) was used for determining, monitoring, and controlling metal evaporation rates and metal deposition rates on the substrate 150. Optical ports 160 for the AAS detection system were located directly above the metal source crucible openings in order to obtain the maximum AAS signal at low evaporation rates. The AAS signal was then used as a closed-loop feedback control signal for the electron beam evaporator sources 120, thereby stabilizing the rates from what can be rather unstable sources. In contrast, the effusion cells 130 are temperature controlled due to their greater stability. A single quartz crystal oscillator (not shown) was built into the MBE system 100 and could be moved to the substrate position to calibrate the AAS detection system when there was no oxygen in the growth chamber 110.

Besides reducing the hardware requirements within the MBE system 100, the AAS detection system significantly reduced the ambiguities created by the exclusive use of a quartz crystal oscillator (QCO) to determine deposition rates and provided the monitoring and control resolution necessary for the present invention. That is, a QCO works on the principle that the natural oscillation frequency of the quartz crystal changes as material is deposited on the crystal, not the substrate 150, surface. Specific properties of the deposit material, such as density and Young's modulus, must be programmed into the controller in order to interpret this frequency change in terms of film thickness. However, there is ambiguity about what is being deposited on the crystal surface in a metal oxide MBE experiment. It might be the metal, or a mix of the metal and various oxides of the metal, or all metal oxide(s), depending on where the QCO is located relative to the substrate 150 and the oxygen source. Furthermore, the mix of deposit materials may change with differing oxygen partial pressures in the growth chamber 110. In addition, the sticking coefficients of the metal/metal oxide species on the QCO may be different than those on the substrate 150. The former is held at room temperature, whereas the latter is typically at some elevated temperature.

In contrast, an AAS detection system relies on a gas phase measurement that depends only on the density of the atomic species of interest in the optical path. All of the optics were outside the growth chamber 110, so the AAS detection system could be used to determine, monitor, and control metal evaporation rates and deposition rates on the substrate 150 in a highly reliable and accurate fashion.

The AAS detection system was calibrated using a QCO that was positioned at the same position as that occupied by the substrate 150 during growth. The metal deposition rate was then converted into a growth rate for the oxide of interest by calculating a conversion factor relating the number of metal atoms per $cm^2$ in each Å of metal to the number of metal ions per $cm^2$ per layer in the cation sublattice of the metal oxide, assuming a sticking coefficient of unity for the metal in the oxide film. This assumption is expected to be valid for growths carried out at substrate temperatures that are well below the desorption temperatures of either the metal or its oxides. The atomic absorption of the metal species in the gas phase was then directly related to the actual growth rate of the metal oxide film. It was found that the film thicknesses predicted in this way agreed with those measured ex situ after growth by Rutherford Backscattering Spectroscopy or Transmission Electron Microscopy to within ~10%.

The substrate 150 was heated to a growth temperature by electron beam bombardment from the backside. The heaters (not shown) were located on the manipulator docking stages. A reflection high-energy electron diffraction (RHEED) gun 170 was used as a real-time structural and surface-morphological probe of film growth. The growth chamber 110 was also coupled to two other chambers (not shown) housing atomic force and scanning tunneling microscopy (AFM and STM) and x-ray photoelectron spectroscopy and diffraction (XPS and XPD) capabilities by means of a 7 m long transfer tube. The AFM/STM was a Park Instruments VP microscope that was specially modified to receive Thermionics sample platens via ultra-high vacuum (UHV) transfer. The XPS/XPD chamber housed a Gammadata/Scienta 200 mm energy analyzer with multichannel detector and monochromatic Alkα X-ray source along with a He resonance lamp and reverse-view low-energy electron diffraction (LEED) optics. This spectrometer was used to perform scanned-angle XPD, as well as ultraviolet photoemission spectroscopy (UPS) and XPS. This selection of surface science tools, in combination with oxygen plasma-assisted MBE, allowed a wide range of metal oxide crystalline films to be synthesized and characterized, all in one UHV environment.

EXAMPLE

The magnetic anisotropy of bulk crystalline Co ferrite is approximately 30 times larger than that of isostructural Ni ferrite ($NiFe_2O_4$) and 20 times larger than that of magnetite. The enhanced magnetic properties of Co ferrite essentially result from an unquenched orbital magnetic moment exhibited by Co(II) ions at octahedral sites in the asymmetric crystalline field. Co(II) exhibits this enhancement when in the octahedral field of oxygen anions, with Fe(III) cations as next-nearest neighbors. This local environment is unique to the Co ferrite inverse spinel structure and can be achieved in deposited films by ensuring that the deposited Co atoms are in the thermodynamically stable octahedral lattice sites of the Co ferrite (i.e., the Co atoms are in the equilibrium state).

A specific example of the present invention is provided herein. In this example, a Co ferrite film on a substrate was made in accordance with the present invention and resulted in desirable properties including magnetic and surface smoothness. For example, the Co ferrite film exhibited excellent hysteresis, with 40% remanence at room temperature and 65% remanence at 150K. No post-growth annealing treatment was required. The as-grown film formed a perfect inverse spinel structure, with greater than about 90% of the Co(II) at octahedral sites in the lattice (that is, in thermodynamically stable positions), and the resulting surfaces were atomically flat.

As is evident to those skilled in the art, the present invention is not limited to such an example and other metal oxide films may be formed on substrates in accordance with the present invention to exploit magnetic, as well as other, properties resulting from growth in a substantially equilibrium state. Furthermore, the present invention is not limited to utilization of an AAS detection system. Other detection systems may be used to control deposition rates as long as such systems have similar or improved reliability, accuracy, and resolution.

Figures 2A, 2B:
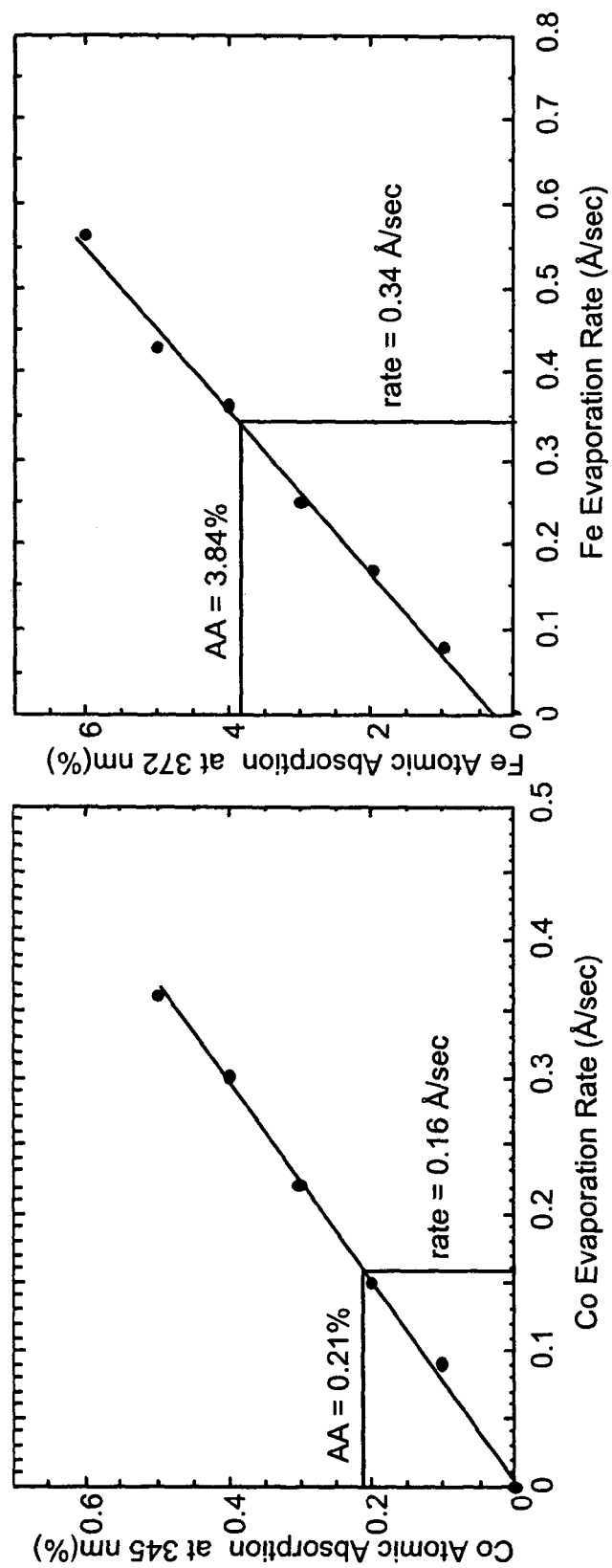
FIG. 2a illustrates an atomic absorption/metal evaporation rate calibration curve for Co, showing the evaporation rates required to synthesize Co ferrite that is stoichiometric to within 10%. The evaporation rates were determined by a quartz crystal oscillator at the substrate location.
FIG. 2b illustrates an atomic absorption/metal evaporation rate calibration curve for Fe, showing the evaporation rates required to synthesize Co ferrite that is stoichiometric to within 10%. The evaporation rates were determined by a quartz crystal oscillator at the substrate location.

Important to successful thin-film growth of Co ferrite is the ability to control the absolute evaporation rates of Fe and Co, as well as the activated oxygen partial pressure at the substrate. In this example, the previously described MBE system 100 and experimental setup were used to produce the spinel-structured metal oxide of Co ferrite. FIGS. 2a–2b illustrate atomic absorption/metal evaporation rate calibration curves for Co and Fe, respectively, showing the evaporation rates required to synthesize stoichiometric Co ferrite (to within 10%) at the same total metal deposition rate used to synthesize stoichiometric $Fe_3O_4$.

An MgO(001) substrate that had been ultrasonically degreased in acetone and isopropanol (5 minutes each) was placed into the MBE system 100. The ECR oxygen plasma source 140 was ignited and the substrate 150 was exposed to the plasma for a few minutes at a pressure from $1\times10^{-5}$ torr to $1\times10^{-3}$ torr, and a power level from 200 W to 220 W, in order to remove adventitious carbon from the surface of the substrate 150. The substrate 150 was brought up to a growth temperature of between 150° C. and 350° C. 250° C. was preferred to maximize crystalline quality while minimizing Mg outdiffusion from the substrate 150.

The oxygen chamber pressure was then lowered to $1\times10^{-5}$ torr and the plasma forward power lowered to 200 W (in order to get in the middle of the $Fe_3O_4$ region of the growth parameter space). The Fe and Co atom beams were then activated (from either the electron beam evaporator sources 120 or effusion cells 130) so that the absolute evaporation rates of Co and Fe at the substrate 150 were 0.16±0.02 and 0.34±0.02 Angstroms per second, respectively. The Fe and Co shutters were both opened simultaneously and the Co ferrite grown on the substrate 150 until the desired thickness was reached. The growth rate for Co ferrite under these conditions was ~1.2 Angstroms per second. The use of a relatively slow growth rate and a modest substrate temperature allowed the Co atoms to diffuse to their preferred equilibrium, or thermodynamically stable, positions within the octahedral layers, assume a +2 oxidation state, and form a perfect inverse spinel structure. The growth was terminated by simultaneously closing both Fe and Co shutters and turning off the ECR oxygen plasma source 140. The sample remained at growth temperature until the residual oxygen was pumped out to a chamber pressure of $<\sim1\times10^{-7}$ torr, in order to prevent oxidation of Co(II) ions in the near surface region to Co(III). The sample was cooled slowly (~1 degree C. per second) down to room temperature and helped to prevent film delamination.

Figures 3A, 3B:
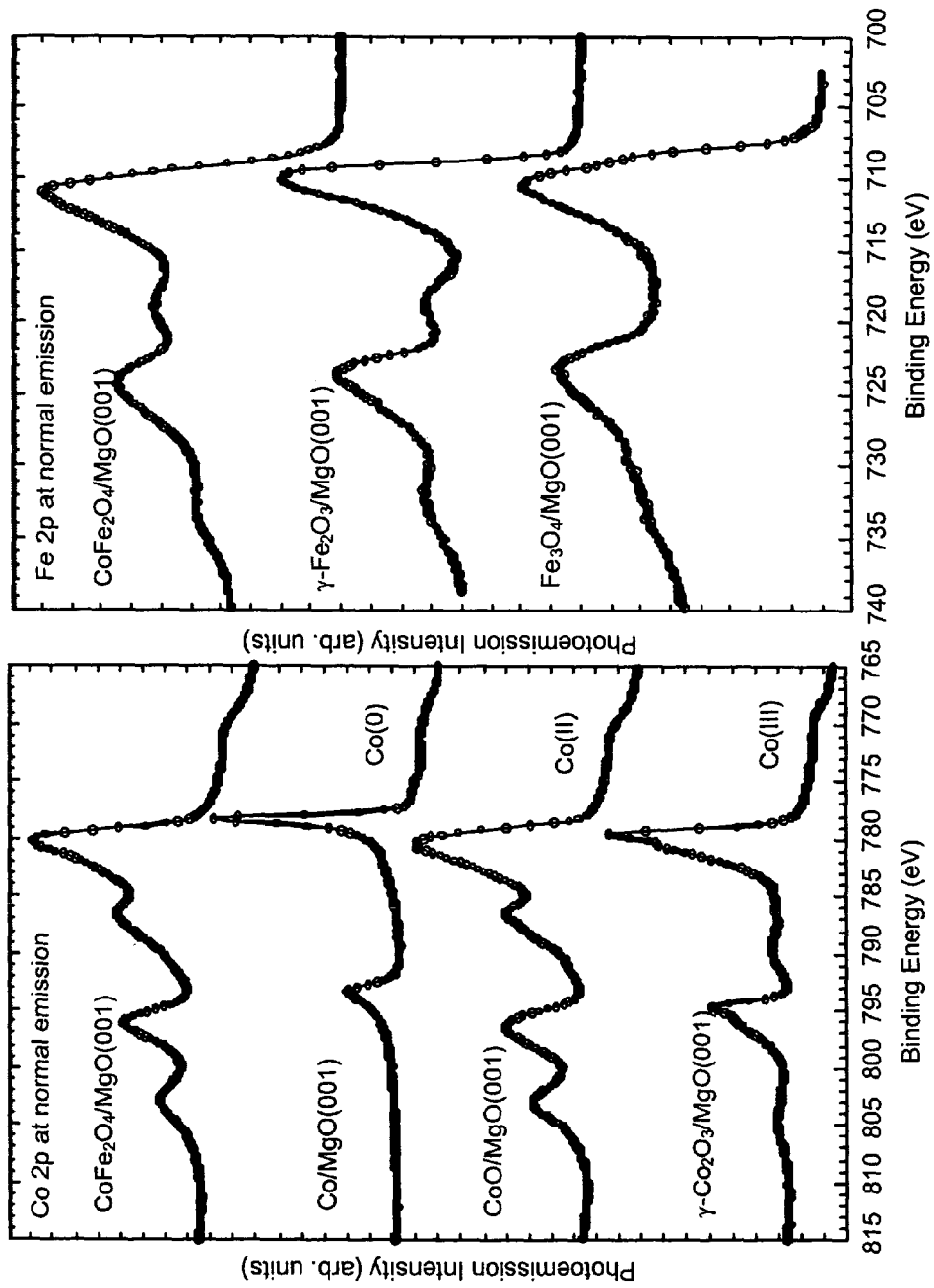
FIG. 3a shows a Co 2p core-level photoemission spectra for Co ferrite and appropriate oxygen plasma assisted MBE grown standards that establish that Co is in the +2 formal oxidation state in Co ferrite.
FIG. 3b shows a Fe 2p core-level photoemission spectra for Co ferrite and appropriate OPA-MBE grown standards that establish that the majority of the Fe is in the +3 formal oxidation state in Co ferrite. The remainder is in the +2 oxidation state.
Figures 4A, 4B, 4C, 4D:
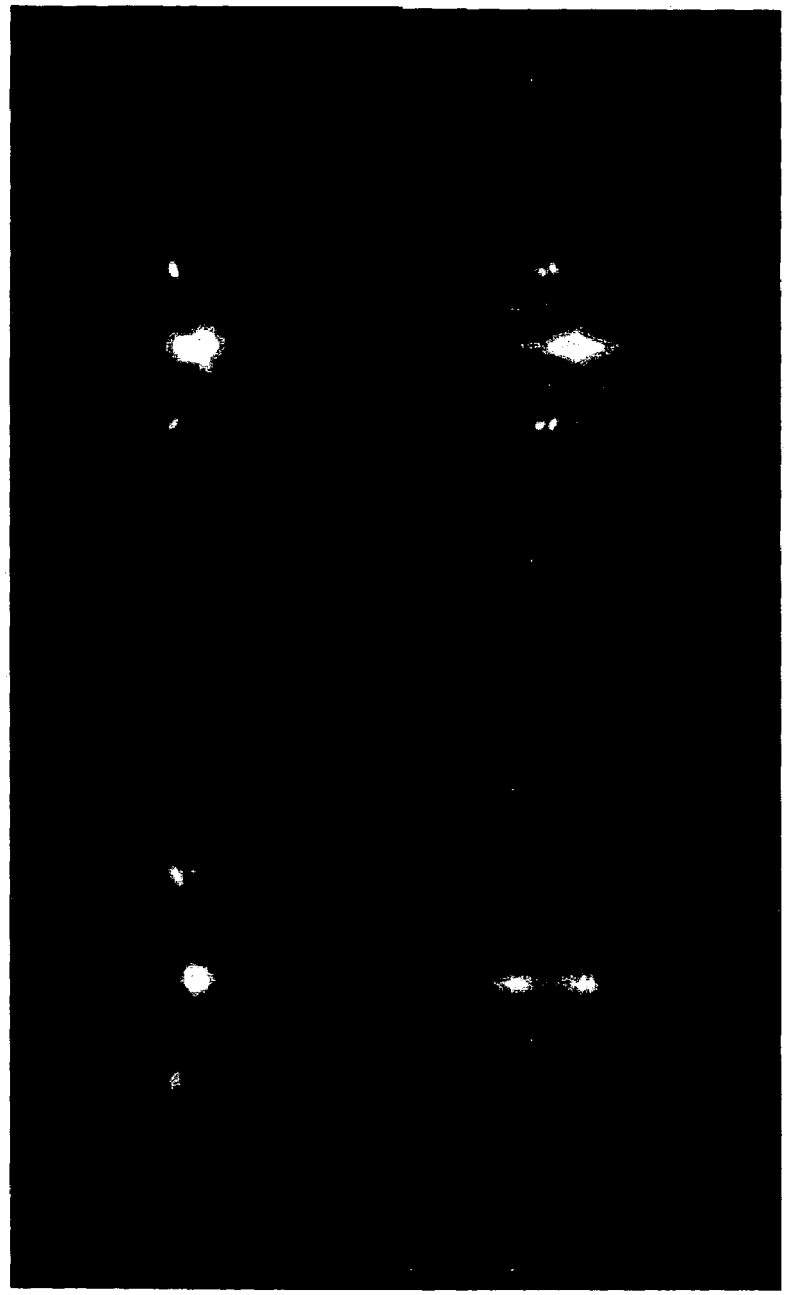
FIG. 4a shows a RHEED pattern for an MgO(001) substrate in the [100] direction.
FIG. 4b shows a RHEED pattern for an MgO(001) substrate in the [110] direction.
FIG. 4c shows a RHEED pattern for a 100 nm thick Co ferrite film in the [100] direction.
FIG. 4d shows a RHEED pattern for a 100 nm thick Co ferrite film in the [110] direction.

An objective in this example was to synthesize a perfect inverse spinel structure, in which all Co would be in the +2 formal oxidation state, and would occupy half the octahedral cation sites. The other half of the octahedral cation sites, as well as all tetrahedral cation sites, would be occupied by Fe(III). FIGS. 3a–3b show high-resolution Fe 2p and Co 2p core-level spectra for the grown Co ferrite film and appropriate MBE grown standards that illustrated that this method generated the desired oxidation states for both Co and Fe. Comparison of the Co 2p spectrum for Co ferrite with that of the two reference films (CoO and $\gamma$-Co$_2$O$_3$) reveals that all Co is in the +2 oxidation state. Comparison of the Co ferrite Fe 2p spectrum with those of standard films reveals a better match to $\gamma$-Fe$_2$O$_3$ than to Fe$_3$O$_4$. However, the match is not perfect, and direct superposition reveals the presence of some Fe(II) in the Co ferrite film. This conclusion is further supported by Fe L-edge XAS results. This particular film was shown to have a composition of Co$_{0.9}$Fe$_{2.1}$O$_4$ and is therefore slightly Fe rich. As a result, some Fe(II) is present in the octahedral cation sublattice at sites that would normally be occupied exclusively by Co(II) if the stoichiometry was exactly Co$_{1.00}$Fe$_{2.00}$O$_4$. The presence of Co(II) and Fe(III) in the lattice suggests that the inverse spinel structure has been achieved. However, structural determination by XPD had been inconclusive regarding the lattice site occupancies of Co and Fe. Co and Fe K-shell extended x-ray absorption fine structure (EXAFS) measurements at Stanford Synchrotron Radiation Laboratory (SSRL) have been carried out and conclusively show that 100% of the Co(II) is at octahedral sites, with the remainder of the octahedral sites being occupied by Fe(III) and a small residual of Fe(II). All tetrahedral sites ace occupied by Fe(III). Thus, there is no Co(II) at tetrahedral sites, and a perfect inverse spinel crystalline film has been grown.

Structural and surface morphological studies by RHEED, XRD and AFM revealed excellent crystallinity and atomically flat film surfaces. FIGS. 4a–4d show typical RHEED patterns for the substrate and film surfaces that revealed both the extent of crystallographic order and flatness of the film surface. The new diffraction streaks seen in the film patterns are characteristic of the factor-of-two difference in the lattice parameters for MgO and Co ferrite. AFM images (not shown) reveal root-mean-square roughnesses of only 0.1–0.2 nm for 100 nm thick films, which is considerably better than that published for PLD-grown Co ferrite. In addition, out-of-plane XRD rocking curves obtained with nonmonochromatic Cu K$\alpha$ x-rays revealed full-width at half-maximum values of ~0.09 degrees, which indicates excellent crystallinity within the bulk of the film.

Figure 5:
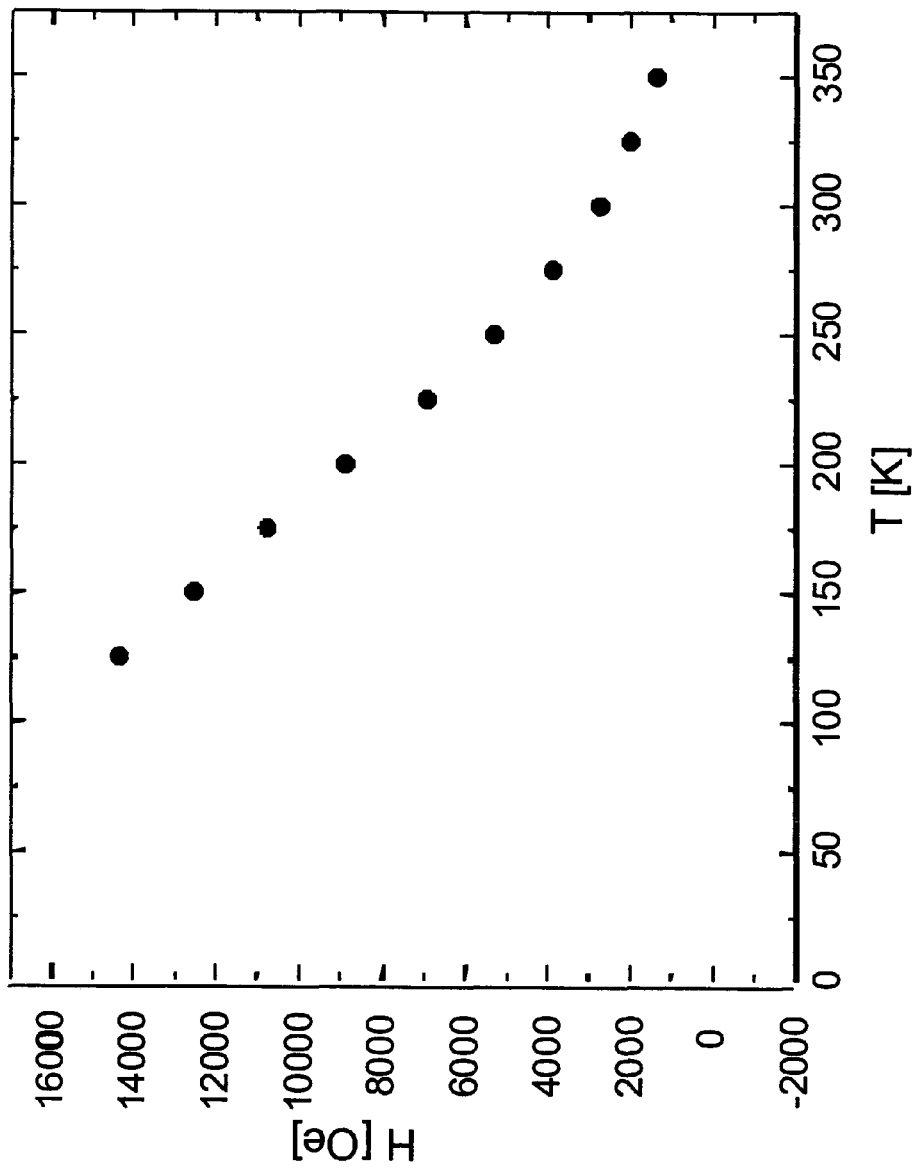
FIG. 5 graphically illustrates an in-plane coercive field as a function of temperature of a 100 nm thick Co ferrite epitaxial film on MgO(001).

Finally, magnetic force microscopy (MFM) images revealed large, stable magnetic domains of lateral dimension ~140 nm for 100 nm thick films. In addition, superconducting quantum interference device (SQUID) hysteresis loops showed in-plane magnetic remnances of 65% and 40% at 150K and 300K, respectively, for a field orientation along [100]. The in-plane coercive field as a function of temperature showed very high values at low temperatures (e.g. >14 KOe at 125K), but also ~1 KOe at 350K, revealing that the Curie temperature is above 300K (see FIG. 5) Thus, the material shows excellent promise, for example, as a pinning layer in read/write devices that would operate at, or above, room temperature.

CLOSURE

While embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A method of making an inverse spinel-structured Co ferrite on a substrate by oxygen plasma assisted molecular beam epitaxy, wherein at least 90% of the cobalt atoms occupy octahedral lattice positions of the Co ferrite during growth of the Co ferrite, comprising the step of supplying activated oxygen from an oxygen plasma source, an iron atom flux, and a cobalt atom flux to the surface of said substrate, wherein said iron and cobalt atom fluxes are individually controlled at said substrate by an atomic absorption spectroscopy detection system.

2. The method as recited in claim 1, wherein said substrate is MgO.

3. The method of claim 1, wherein said substrate is selected from the group consisting of SrO, MgO, BaO, MgAl$_2$O$_4$, SrTiO$_3$.

4. The method of claim 1, which includes performing the growth at a temperature between 200° and 300° C.

5. The method of claim 1, further comprising growing a spinal buffer layer on the substrate by molecular beam epitaxy before growing the binary ferrite.

6. A method, comprising:
providing a substrate in a chamber;
selectively supplying activated oxygen, a cobalt atom flux, and an iron atom flux to the chamber;
performing molecular beam epitaxy to epitaxially grow an inverse spinel-structured ferrite on the substrate from the oxygen, the cobalt atom flux, and the iron atom flux; and
as the ferrite epitaxially grows during said performing, occupying octahedral lattice positions of the ferrite with cobalt to provide the ferrite in a substantially thermodynamically stable state absent post-growth annealing.

7. The method of claim 6, wherein the substrate is selected from the group consisting of SrO, MgO, BaO, MgAl$_2$O$_4$, SrTiO$_3$.

8. The method of claim 6, which includes maintaining a substrate temperature between about 200° and about 300° C. during said performing.

9. The method of claim 6, wherein at least 90% of the cobalt atoms occupy the octahedral lattice positions of the ferrite as the ferrite is grown during said performing.

10. The method of claim 6, wherein said supplying includes individually controlling the cobalt atom flux and the iron atom flux with an atomic absorption spectroscopy detection system.

11. The method of claim 6, wherein at least 90% of the cobalt atoms occupy the octahedral lattice positions of the ferrite as the ferrite is grown during said performing and said supplying includes individually controlling at least one of the cobalt atom flux and the iron atom flux with an atomic absorption spectroscopy detection system.

12. A method, comprising:
providing a substrate in a chamber;
controllably supplying activated oxygen, a cobalt atom flux, and an iron atom flux to a surface of the substrate in the chamber, said supplying including individually controlling at least one of the cobalt atom flux and the iron atom flux with a spectroscopy detection system; and
during said supplying, epitaxially growing an inverse spinel-structured ferrite on the substrate with cobalt atoms occupying octahedral lattice positions of the ferrite during said growing to provide the ferrite in a substantially thermodynamically stable state.

13. The method of claim 12, which includes controlling pressure in the chamber and temperature of the substrate.

14. The method of claim 12, wherein the substrate is selected from the group consisting of SrO, MgO, BaO, $MgAl_2O_4$, $SrTiO_3$.

15. The method of claim 12, which includes maintaining a substrate temperature between about 200° and about 300° C. during said performing.

16. The method of claim 12, wherein at least 90% of the cobalt atoms occupying the octahedral lattice positions of the ferrite as the ferrite is grown during said performing.

17. The method of claim 12, wherein said individually controlling includes separately controlling both the cobalt atom flux and the iron atom flux.

18. The method of claim 12, wherein the spectroscopy detection system is of an atomic absorption type.

19. The method of claim 12, where said supplying includes providing the oxygen from an oxygen plasma source.

* * * * *